United States Patent
Yang et al.

(10) Patent No.: US 6,221,792 B1
(45) Date of Patent: *Apr. 24, 2001

(54) METAL AND METAL SILICIDE NITRIDIZATION IN A HIGH DENSITY, LOW PRESSURE PLASMA REACTOR

(75) Inventors: Yun-Yen Jack Yang, San Jose; Ching-Hwa Chen, Milpitas; Yea-Jer Arthur Chen, Fremont, all of CA (US)

(73) Assignee: Lam Research Corporation, Fremont, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/881,710

(22) Filed: Jun. 24, 1997

(51) Int. Cl.$^7$ .................................................. H01L 21/44
(52) U.S. Cl. ..................... 438/776; 438/683; 438/649; 438/651; 438/655
(58) Field of Search ............................. 438/776, 777, 438/775, 683, 785, 762, 627, 798, 623, 649, 685, 656, 695

(56) References Cited

U.S. PATENT DOCUMENTS

| | | | | |
|---|---|---|---|---|
| 5,326,404 | * | 7/1994 | Sato | 118/723 |
| 5,334,264 | | 8/1994 | Meletis . | |
| 5,545,592 | * | 8/1996 | Iacoponi | 438/683 |
| 5,552,340 | | 9/1996 | Lee et al. . | |
| 5,559,047 | * | 9/1996 | Urabe | 438/592 |
| 5,686,796 | * | 11/1997 | Boswell et al. | 315/111.51 |
| 5,702,564 | * | 12/1997 | Shen | 156/643.1 |
| 5,719,446 | * | 2/1998 | Taguchi et al. | 257/751 |
| 5,725,740 | * | 3/1998 | Raaijmakers | 204/192.12 |
| 5,747,384 | * | 5/1998 | Miyamoto | 438/685 |

FOREIGN PATENT DOCUMENTS

| | | |
|---|---|---|
| 06097111 | 8/1994 | (EP) . |
| WO 95/34092 | * 12/1995 | (WO) . |

OTHER PUBLICATIONS

Wolf, silicon processing for the VLSI ERA, vol. 2, pp. 121–123, 1990.*

Jong Moon et al., "Formation of TiN by nitridation of magnetron sputtered Ti films using microwave plasma CVD," Journal of Crystal Growth, vol. 115, No. 1/04, Dec. 2, 1991, pp. 589–595.

Kamoshida, K. et al., "Self–Aligned TiN Formation by $N_2$ Plasma Bias Treatment of $TiSi_2$ Deposited by Selective Chemical Vapor Disposition,"Japanese Journal of Applied Physics, vol. 36, No. 2, Feb. 1997, pp. 642–647.

Chang, K. et al., "Nitridation of Fine Grain Chemical Vapor Deposited Tungsten Film as Diffusion Barrier for Aluminum Metallization," Journal of Applied Physics, vol. 81, No. 8, Part 01, Apr. 15, 1997, pp. 3670–3676.

* cited by examiner

*Primary Examiner*—Charles Bowers
*Assistant Examiner*—Thanh Nguyen
(74) *Attorney, Agent, or Firm*—Beyer Weaver & Thomas, LLP

(57) ABSTRACT

A nitridization process to form a barrier layer on a substrate is described. The nitridization process includes depositing a layer of metal or metal silicide on a surface of the substrate, placing the substrate into a high density, low pressure plasma reactor, introducing into the high density low pressure plasma reactor a gas including nitrogen, and striking a plasma in the high density, low pressure plasma reactor under conditions that promote nitridization of at least a portion of the layer of metal or metal silicide to produce a composition of metal nitride or metal silicon nitride, respectively.

24 Claims, 4 Drawing Sheets

| PARAMETERS | BROAD RANGE | PREFERRED RANGE | MORE PREFERRED RANGE |
|---|---|---|---|
| Pressure (mTorr) | 1 – 100 | 2 – 50 | 10 – 30 |
| RF bias power (Watts) | 0 – 1000 | 0 – 500 | 10 – 300 |
| Temperature (°C) | 20 – 300 | 20 – 200 | 20 – 100 |
| Top electrode power (Watts) | 200 – 3000 | 400 – 1500 | 500 – 750 |
| Flowrate of $N_2$ (sccm) | 10 – 1000 | 20 – 500 | 50 – 200 |

Figure 4

METAL AND METAL SILICIDE NITRIDIZATION IN A HIGH DENSITY, LOW PRESSURE PLASMA REACTOR

BACKGROUND OF THE INVENTION

The present invention relates to nitridization of a metal or metal silicide layer to form a metal nitride or metal silicon nitride barrier layer in a contact hole or a via of an integrated circuit (IC). More particularly, the present invention relates to nitridization of a metal or metal silicide layer in a high density, low pressure plasma system to form a metal nitride or metal silicon nitride barrier layer having a substantially uniform composition along a depth of a contact hole or a via of an integrated circuit (IC).

In the semiconductor fabrication art, (e.g., the fabrication of integrated circuits or flat panel displays from substrates) refractory metal nitrides, e.g., titanium nitride (TiN), and refractory metal silicon nitrides, e.g., tungsten silicon nitride (W—Si—N), are commonly employed as barrier layer materials inside a contact hole or a via. Contact holes and vias are openings that are typically formed in a dielectric layer, such as a silicon dioxide layer. By way of example, FIG. 1A shows a partially fabricated integrated circuit 10 including a contact hole 16, which is formed by etching through a silicon dioxide layer 14 (hereinafter referred to as "oxide layer 14") to provide an opening to an underlying substrate layer 12. In subsequent IC fabrication steps, contact hole 16 may be filled with conductive materials such as tungsten, copper or aluminum, to ultimately form contact plugs that provide a conductive pathway between an IC substrate and, for example, a polysilicon layer disposed above the IC substrate.

Vias are similarly formed and filled to provide conductive pathways between successive layers of metallization disposed above the IC substrate.

Before the contact hole or via is filled with conductive material, a barrier layer may be fabricated to prevent the diffusion of conductive material such as aluminum from the conductive into the silicon substrate layer. By way of example, a barrier layer conformally deposited on the surface of IC 10, partially fills contact hole 16 and effectively prevents the diffusion of particles from subsequently deposited aluminum metal into silicon substrate layer 12. It is well known in the art that the ingress of such conductive particles into the silicon substrate layer can increase the conductivity of the silicon substrate layer and lead to catastrophic device failures.

Traditionally, such barrier layers have been fabricated on IC surfaces by the well known technique of chemical vapor deposition (CVD). Briefly, in chemical vapor deposition (CVD), a chemical containing atoms of the material to be deposited reacts with another chemical to produce the desired material on the substrate surface while the byproducts of the reaction are removed from the reaction chamber.

Fabrication of a titanium nitride (TiN) barrier layer, for example, may begin when partially fabricated IC 10 of FIG. 1A is secured on a chuck in a deposition chamber. Next, an inert atmosphere is created in the deposition chamber, where the substrate may be maintained at a high enough temperature, e.g., about 400° C., to provide the necessary energy for the reactant gases to react and deposit on the substrate surface. Next, the reactant gases, which include ammonia ($NH_3$), hydrogen ($H_2$) and organometallic gases containing titanium (Ti) gas may be introduced into the chamber. Such conditions are maintained inside the CVD chamber for so long as it is required to deposit a TiN layer of appropriate thickness.

A CVD process for fabricating a barrier layer, such as a TiN layer, suffers from several drawbacks, however. By way of example, CVD of a barrier layer subjects the IC substrate to high temperatures, which require a high thermal budget and are often incompatible with low temperature metal alloys, such as aluminum alloys, inside an IC. As a further example, the use of organometallic gases make it likely that there may be carbon inclusion in the TiN barrier layer, thereby undesirably lowering the conductivity of the barrier layer and contact plug. Fabrication of a barrier layer by CVD, therefore, also runs the risk of rendering the IC inoperable.

To remedy these problems, the barrier layer is currently fabricated by reactive sputtering. FIG. 1B shows a reactor system 100 typically employed for carrying out reactive sputtering to fabricate a barrier layer. Reactor 100 includes a chamber 108, in which a partially fabricated IC 10, also shown in FIG. 1A, is disposed above a chuck 102. Inside chamber 108, an electrically biased metal target 106 is mounted above chuck 102. The composition of metal target 106 usually depends on the kind of barrier layer that is to be formed. If a TiN barrier layer is to be fabricated, for example, then metal target 106 may include titanium (Ti). Chamber 108 may also come fitted with a gas inlet 110 and outlet (not shown to simplify illustration). Gas inlet 110 is designed to supply reactive gases inside chamber 108 and gas outlet may be designed to evacuate gaseous byproducts from chamber 108.

A typical reactive sputtering process in reactor 100 of FIG. 1B begins when partially fabricated IC 10 is secured on chuck 102. Vacuum conditions are then created in chamber 108, before a reactive gaseous mixture including argon (Ar) and nitrogen ($N_2$) is introduced into chamber 108 via gas inlet 110. Next, the reactive gas is ionized by a radio frequency generator, for example, producing positively charged nitrogen and argon ions. The argon ions are attracted and accelerate towards target 106, which is bombarded with the radio frequency-excited argon ions. Consequently, some atoms and molecules are "knocked off" target layer 106 and the dislodged target material, e.g. titanium ions, reacts with the nitrogen ions in the gas phase to produce metal nitride (e.g. TiN), which deposits on substrate 104 and forms the barrier layer.

Unfortunately, the reactive sputtering process described above also has several drawbacks. By way of example, it is difficult to sputter deposit a barrier layer of uniform composition throughout the depth of the contact hole or via, as the IC technology moves to smaller critical dimensions, e.g. on the order of 0.35 $\mu$m to 0.13 $\mu$m or smaller, and greater feature depth, e.g. approaching 3 $\mu$m in some instances. Contact holes and vias realized in this technology have aspect ratios as high as about 4:1 and about 5:1. For such high aspect ratios, the collision frequency between the nitrogen and titanium ions varies along the depth of the contact hole or via. By way of example, the collision frequency between the nitrogen and titanium ions near the top of contact hole 16 of FIG. 1A will be different than that near the bottom or some distance below the top of the contact hole. As a result, the reaction rate of forming the barrier layer will vary along the depth of contact hole 16 of FIG. 1A. The resulting barrier layer has a nonuniform composition, i.e. nitrogen and titanium ions are present in the barrier layer composition in different stoichiometric ratios, throughout the depth of the contact hole. Barrier layers with nonuniform composition throughout the depth of the contact hole are undesired for many reasons. By way of example, those skilled in the art will recognize that the performance of a barrier layer with nonuniform composition will be unpredictable. It is likely that the barrier layer composition over some areas of the contact hole will not effectively prevent diffusion of conductive particles, such as aluminum metal particles, into the substrate layer, thereby making the IC more susceptible to device failure.

As another example, the reactive sputtering process described above suffers from poor repeatability, i.e. the composition of the barrier layer fabricated in the contact holes or vias of few initial ICs will be different from that fabricated in the contact holes or vias of subsequent ICs. The barrier layer composition changes because the metal target layer in the reactor chamber undergoes a compositional change due to nitridization of the target layer after the fabrication of barrier layers in the few initial ICs. In other words, during the constant bombardment of the metal target layer by argon (Ar) ions, while fabricating barrier layers in the few initial ICs, some of the nitrogen ions react with the metal target layer, thereby causing the nitridization of the target layer. Thereafter, barrier layers formed in subsequent ICs by the contaminated metal target layer may have a different composition. As mentioned above, inadequate barrier layer composition (in subsequent ICs) may lead to device failures.

As yet another example, reactive sputtering also runs the risk of undesired excessive gas phase nucleation, during which large particles of the barrier layer, e.g. TiN, are formed in the gas phase before such particles strike the substrate surface. Of course one skilled in the art would appreciate that appropriately sized particles should strike the substrate surface for barrier layer deposition.

Therefore, what is needed is an improved nitridization process that provides a uniform composition of a barrier layer along the depth of the contact hole or via.

SUMMARY OF THE INVENTION

To achieve the foregoing, the present invention provides a nitridization process to form a barrier layer on a substrate. The nitridization process includes depositing a layer of metal or metal silicide on a surface of the substrate, placing the substrate into a high density, low pressure plasma reactor, introducing into the high density, low pressure plasma reactor a gas including nitrogen, and striking a plasma in the high density, low pressure plasma reactor under conditions that promote nitridization of at least a portion of the layer of metal or metal silicide to produce a composition of metal nitride or metal silicon nitride, respectively.

The nitridization process of the present invention is a marked improvement over the conventional processes of forming a barrier layer. By way of example, the barrier layer fabricated according to the present invention in ICs including contact holes or vias having aspect ratios of at least about 4:1 have a substantially uniform composition throughout the depth of the contact hole or via. As another example, nitridization of the metal or metal silicide layer by a high density, low pressure plasma reactor eliminates the poor repeatability of the barrier layer composition encountered by the conventional reactive sputtering processes. As yet another example, nitridization in a high density, low pressure plasma reactor also effectively eliminates the risk of excessive gas phase nucleation.

These and other features of the present invention will be described in more detail below in the detailed description of the invention and in conjunction with the following figures.

BRIEF DESCRIPTION OF THE DRAWINGS

FIG. 4 is a table that sets forth the approximate values of the important parameters of the inventive process in the embodiment of FIG. 3.

DETAILED DESCRIPTION OF THE PREFERRED EMBODIMENTS

The present invention provides a process for nitridization of a metal or metal silicide layer in a high density, low pressure plasma reactor to form a metal nitride or metal silicon nitride barrier layer in a contact hole or a via of an integrated circuit (IC). The present invention also provides an integrated circuit (IC) including barrier layers having a substantially uniform composition throughout a depth of contact holes, which have aspect ratios that are at least about 4:1. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention. By way of example, although the following discussion describes in detail the fabrication of barrier layers in contact holes, such barrier layers may be formed in vias as well.

Figure 1A:
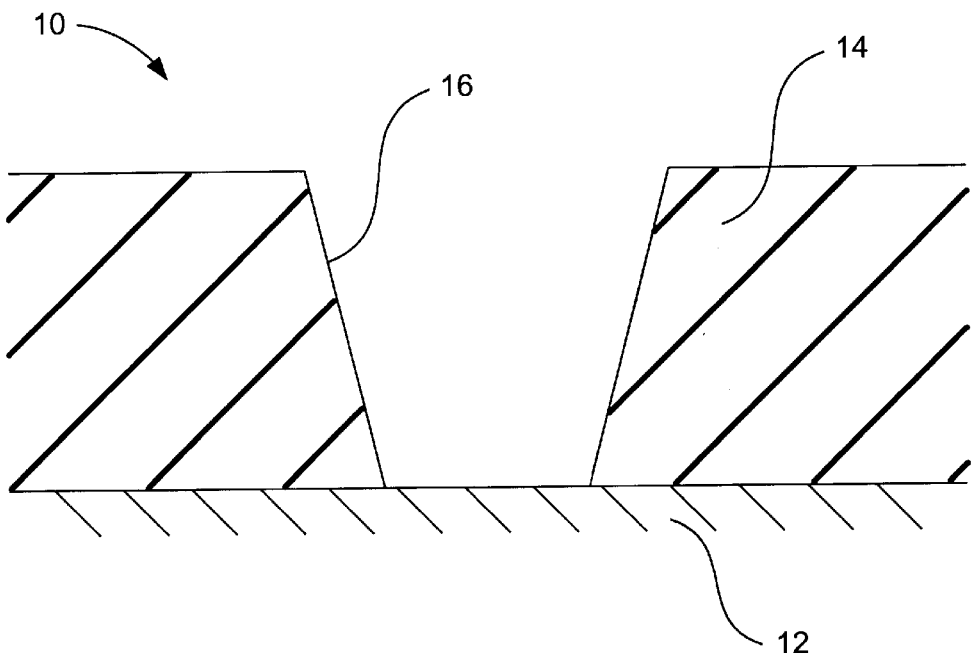
FIG. 1A is a cross-sectional view of a partially fabricated integrated circuit having a contact hole, upon which a barrier layer according to the present invention may by deposited.

The process of forming a barrier layer, according to one embodiment of the present invention, begins by depositing a metal or metal silicide layer in a contact hole of a partially fabricated IC of FIG. 1A, for example, by conventional methods known to those skilled in the art. In one preferred embodiment, the metal or metal silicide layer in the present invention is deposited by sputtering. In sputter-depositing a metal or metal silicide layer, a gas including argon is introduced into reactor chamber 108 of FIG. 1B, for example, to facilitate sputtering of a metallic target layer. The dislodged particles from the metallic target layer then deposit on the substrate layer to form the metal or metal silicide. In another embodiment, the metal or metal silicide layer in the present invention may also be deposited by chemical vapor deposition (CVD). CVD may be carried out in a CVD chamber by well known standard processes known to those skilled in the art except the substrate temperature may not be more than about 300° C. and the gaseous mixture introduced into the CVD chamber may exclude ammonia ($NH_3$).

The partially fabricated IC substrate having a metal or metal silicide layer blanket deposited thereon is then placed into a high density, low pressure plasma reactor where at least a portion of the metal or metal silicide layer effectively undergoes nitridization by $N_2$ plasma to form a metal nitride or metal silicon nitride barrier layer, respectively. The barrier layer formed according to the present invention has a uniform composition throughout the depth of the contact hole, which has an aspect ratio that is at least about 4:1. The present invention represents a marked improvement over the prior art fabrication processes and such advantages are described below in detail.

Figure 2:
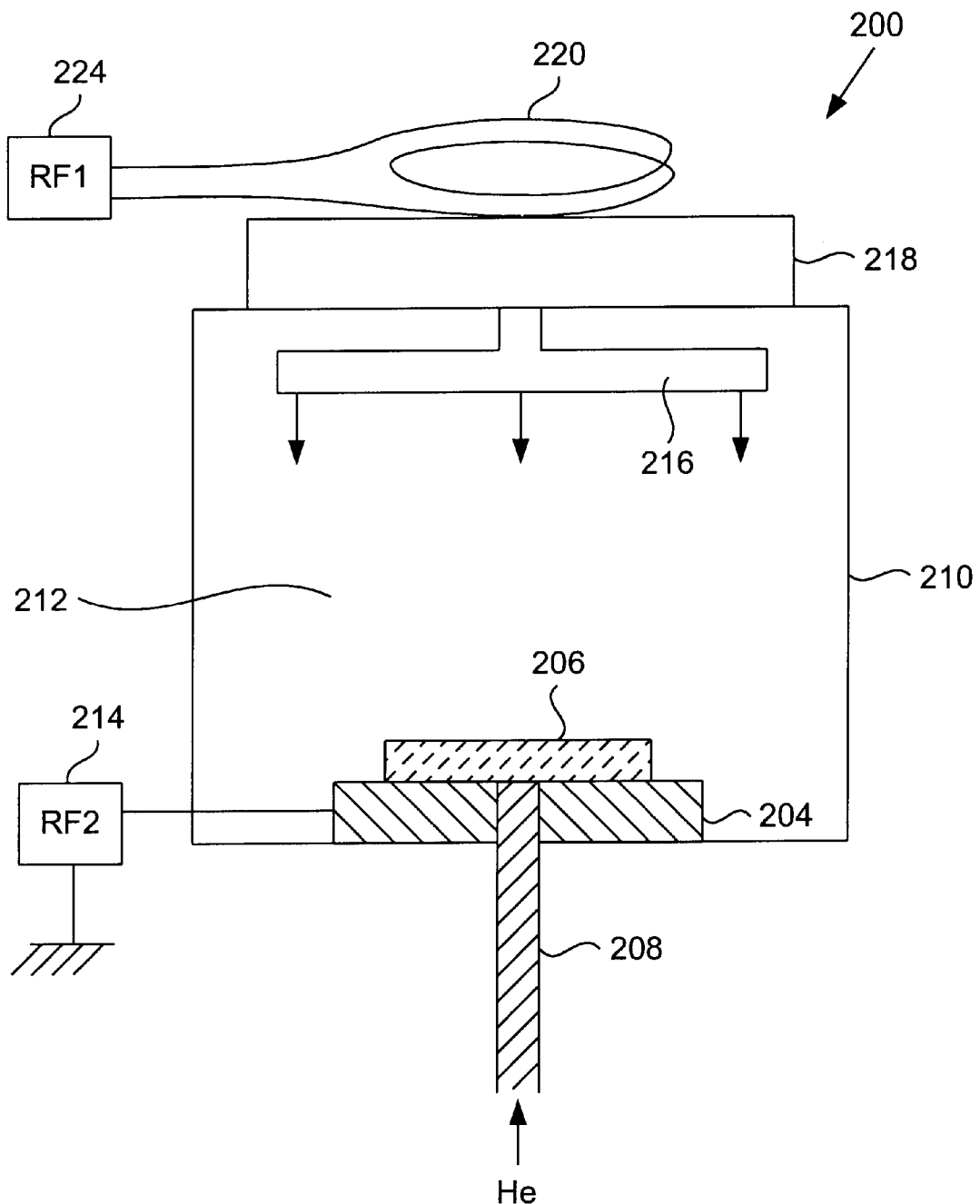
FIG. 2 shows an exemplary transformer coupled plasma system that may be employed for a nitridization process, according to one embodiment of the present invention.

FIG. 2 is a representation of a system 200 that may be employed for nitridization of a metal or metal silicide layer in accordance with the process of this invention. By way of example, system 200 may include TCP™ 9100 etch system, TCP™ 9400 etch system, TCP™ 9600 SE etch system, and TCP™ 9600 PTX etch system, all available from Lam Research Corporation of Fremont, Calif. However, only for exemplary purposes, TCP™ 9400 is described in detail below. It should be borne in mind that the invention is not necessarily limited to any particular system and may in fact be implemented in any high density, low pressure plasma system irrespective of whether energy to the plasma is delivered through capacitively coupled parallel electrode plates, through ECR microwave plasma sources, or through inductively coupled RF sources such as helicon, helical resonators, inductive reactors, electron cyclotron resonance (ECR) reactors. As used in connection with the description of the invention, the term "high density, low pressure plasma system" refers to a plasma generating system that can generate a plasma having a density of greater than about $10^{10}$ ions/cm$^3$ while maintaining a pressure that ranges from a lower limit that may be determined by the lowest pressure at which a plasma can be sustained to about 100 milliTorr. The lower limit in the pressure range mentioned above may be about 0.1 milliTorr. In a preferred embodiment, the present invention may have its plasma induced by an inductive coupling action.

In FIG. 2, system 200 has a reaction chamber 210. Above chamber 210, there is disposed a dielectric window 218 and a coil 220 energized by a radio frequency (RF) generator 224, typically via a matching network (not shown to simplify illustration), operating at a standard frequency of about 13.56 megahertz (MHz). The radio frequency (RF) generator 224 for coil 220 is typically grounded on one end and connected to coil 220 on the other end. Dielectric window 218 can be made of any suitable material, in one embodiment, however, it is made of quartz. Coil 220 implemented in the system can be planar or shaped appropriately according to reactor configuration. Coil 220 may be outside reaction chamber 210 or disposed inside of the chamber, albeit insulated from the plasma by a jacket formed of an appropriate dielectric material.

Inside reaction chamber 210, there is a plasma processing region 212 located between dielectric window 218 and substrate 206. A clamp (not shown to simplify illustration) may be provided to secure substrate 206 on a chuck 204. The clamp may be a mechanical clamp or an electrostatic clamp. In some instances, however, the clamp may not be necessary. Chuck 204 is typically an aluminum work piece and preferably biased (also typically via a matching network) by a radio frequency generator 214, which typically operates at a standard frequency of 13.56 MHz to generate a DC bias which directs the active charged species toward the substrate.

Chuck 206 may be equipped with a helium port 208 that extends from underneath substrate 206 into the substrate/chuck interface and supplies a heat transfer gas such as helium or some other noble gas to the region between substrate 206 and chuck 204 to maintain the temperature of substrate 206 at a desired level during plasma processing. A shower head 216, also known as a gas distribution plate, is provided at the top of reaction chamber 210 to dispense a gas.

A typical process in system 200 begins when substrate 206 is secured on chuck 204 inside reaction chamber 210. A gas including $N_2$ is introduced into reaction chamber 210 via shower head 220. In one embodiment of the present invention, a noble gas such as argon (Ar) may be introduced along with $N_2$ gas. The flow ratio of $N_2$/Ar is generally between about 2:1 to about 10:1. At least, RF generator 224 is turned on to energize coil 220, which acts as the top electrode. In addition, RF generator 214 may be turned on to energize chuck 206, which act as the bottom electrode. The RF energy from coil 220 is transmitted through the transparent dielectric window 218 and enters the plasma processing region 212 where it strikes a plasma. It is believed that the gas including $N_2$ decomposes to produce active species, e.g., $N_2^+$, $N^+$, $N_2^*$, $N^*$, etc., where "*" represents excited states. If RF generator 214 is energized, then the energy from this chuck/electrode imparts additional momentum to the charged species in the plasma on their way toward the substrate.

Coil 220 acts as a positively charged electrode and chuck 204 along with substrate 206 acts as a negatively charged electrode. Basically, chuck 204 and substrate 206 together with the plasma act as a type of diode. When chuck 204 is energized by RF generator 214, it rectifies the RF, producing a sheath of negatively charged DC voltage at the top of the substrate. The substrate surface is, thus, biased negatively to attract the charged active species toward the substrate surface where they land. Once deposited, the active species migrate through the metal or metal silicide layer that is already present as described hereinafter.

Figure 3:
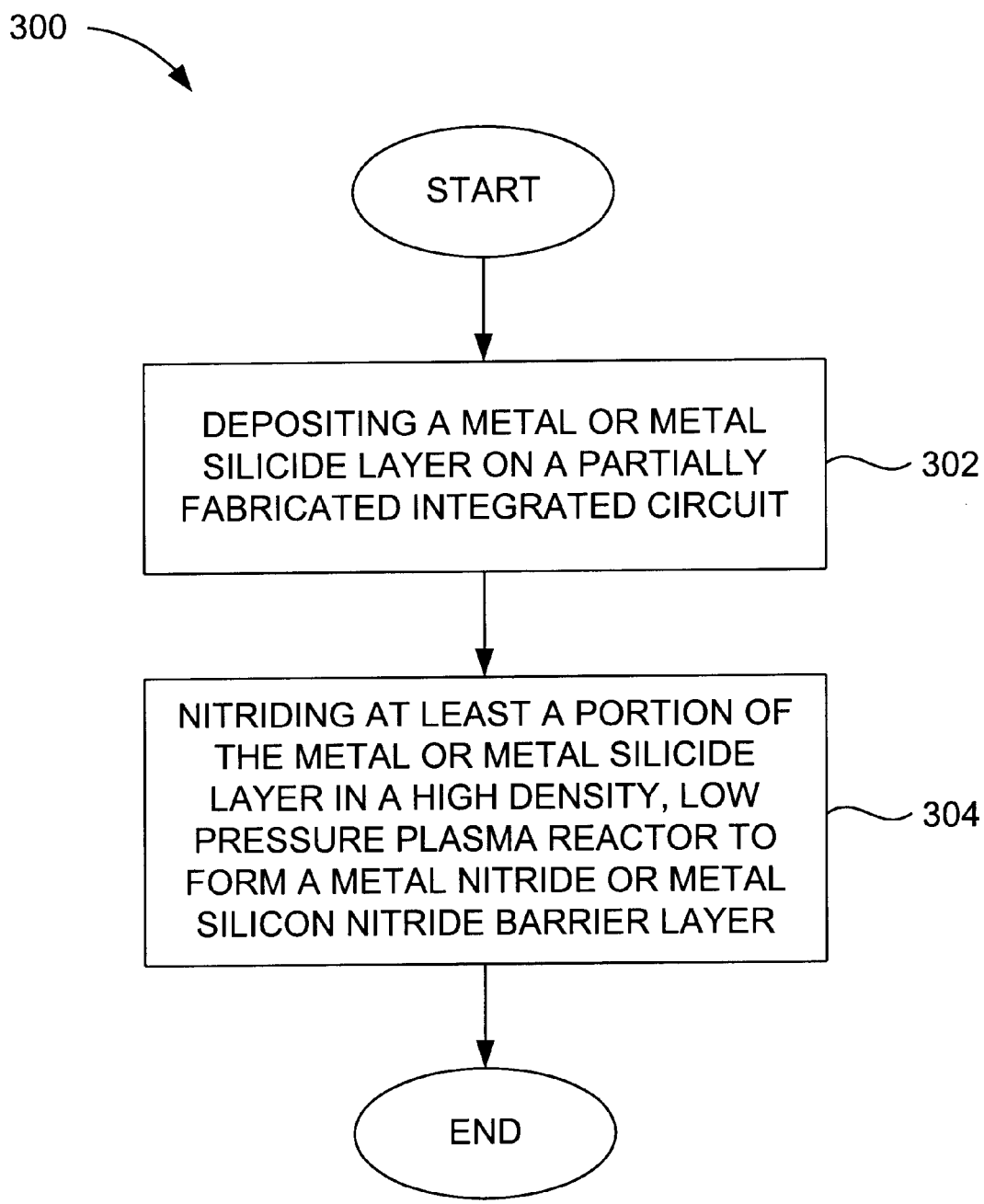
FIG. 3 shows a flowchart of a process for forming a metal nitride or a metal silicon nitride barrier layer according to one embodiment of the present invention.

FIG. 3 is a flowchart of a nitridization process 300, according to one embodiment of the present invention, to form a barrier layer in a contact hole. Before nitridization process 300 is implemented, a partially fabricated IC, such as the one shown in FIG. 1A, may be formed according to conventional IC fabrication processes described above. A step 302 includes depositing a metal or metal silicide layer on a partially fabricated IC substrate having contact holes by conventional methods, e.g. sputtering or CVD, well known to those skilled in the art. In one preferred embodiment, however, the metal or metal silicide layer is fabricated by sputter-deposition because it does not suffer from the drawbacks associated with conventional CVD described above.

Metals that are deposited in step 302, primarily include refractory metals, e.g., titanium (Ti), tungsten (W), tantalum (Ta), molybdenum (Mo), chromium (Cr), niobium (Nb), zirconium (Zr), etc. Similarly, their corresponding silicides include titanium silicide ($TiSi_2$), tungsten silicide ($WSi_2$), tantalum silicide ($TaSi_2$), molybdenum silicide ($MoSi_2$), chromium silicide ($CrSi_2$), niobium silicide ($NbSi_2$), zirconium silicide ($ZrSi_2$), etc. The metal or metal silicide layer deposited in this step may be of any appropriate thickness such that the barrier layer subsequently fabricated on at least a portion of the metal or metal silicide layer is thick enough to effectively prevent diffusion of conductive particles into the oxide layer. For example, the thickness of the metal or metal silicide layer may range from between about 100 and about 1000 Ångstroms and may preferably range from between about 200 and about 400 Ångstroms.

Figure 1B:
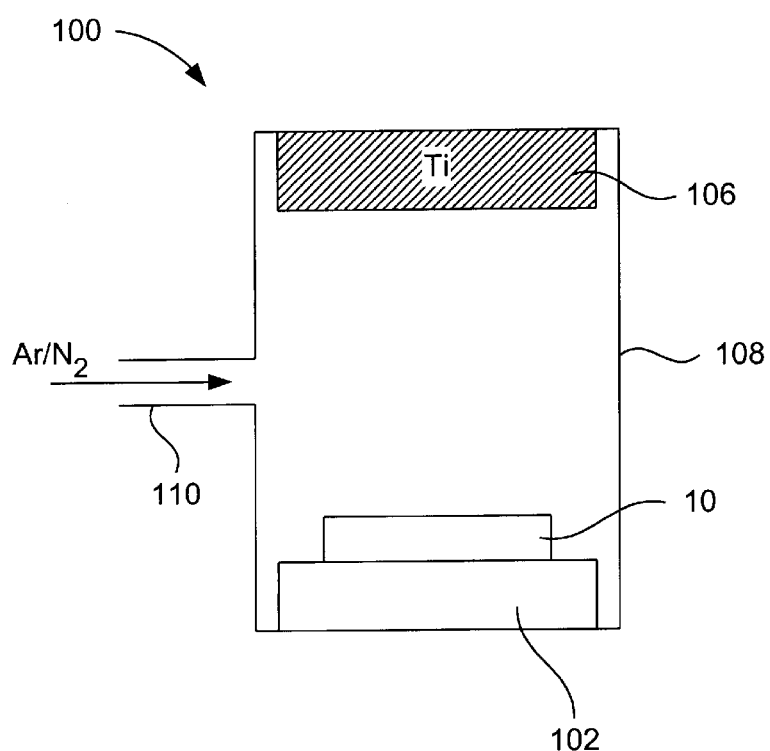
FIG. 1B is a typical reactor configuration for blanket depositing a metal barrier layer on the partially fabricated integrated circuit of FIG. 1A by reactive sputtering.

In a preferred embodiment, step 302 of the present invention includes depositing a metal or metal silicide layer by sputtering, which may be implemented in any physical vapor deposition reactor. By way of example, the reactor system shown in FIG. 1B will work well. The sputtering process in step 302 is substantially similar to the above described reactive sputtering process, except no reactive gaseous mixture is introduced into the reactor chamber. Furthermore, in reactor system 100 of FIG. 1B, a metallic target may include a metal silicide composition corresponding to the metal silicide layer, when it is to be deposited on the substrate surface. Referring to FIG. 1B, after partially fabricated IC 10 is secured on chuck 102 and at least partial vacuum conditions are created in chamber 108, argon (Ar) is introduced into chamber 108. It is important to note that in one embodiment of the present invention, the Ar gas introduced in the reactor chamber of the present invention may not be accompanied by nitrogen ($N_2$) gas because $N_2$ gas is not necessary for the fabrication of a metal or metal silicide layer. The absence of $N_2$ gas during sputtering in one embodiment of the present invention eliminates the above mentioned drawbacks of reactive sputtering, e.g., nitridization of the metal target layer and excessive gas phase nucleation.

In another embodiment, step 302 of the present invention may be carried out in a CVD chamber. The metal or metal silicide layer, according to this embodiment, may be deposited in the contact hole of a partially fabricated IC by standard CVD processes well known to those skilled in the art. A process substantially similar to the CVD process described above may be employed except the substrate temperature may not be more than about 300° C. Such low substrate temperatures in step 302 of the present invention require a lower thermal budget than the conventional CVD process employed in the prior art. Furthermore, the effects arising from the incompatibility of low temperature dielectric materials in the IC with high substrate temperatures are also significantly reduced. Of course the gas introduced in the CVD chamber in step 302 may include hydrogen ($H_2$) and organometallic gases and may exclude ammonia ($NH_3$) because a nitrogen ion source is not necessary to fabricate a metal or metal silicide layer. Some examples of organometallic gases that facilitate CVD of metal or metal silicide layer on a substrate include $TiCl_4$, $Ti(N(CH_3)_2)_4$, and $Ti(N(C_2H_5)_2)_4$.

Next in a step 304, at least a portion of the metal or metal silicide layer of step 302 undergoes nitridization in a high density, low pressure plasma reactor. Nitriding of the metal or metal silicide in one embodiment of the present invention may also be carried out in system 200 shown in FIG. 2 and described above in detail. As used in connection with the description of the invention, the term "nitriding" means converting the metal or metal silicide, for example, to a metal nitride or a metal silicon nitride. Depending on the composition of the metal layer, a metal nitride barrier layer formed in this step includes such materials as titanium nitride (TiN), tungsten nitride (WN), tantalum nitride (TaN), molybdenum nitride (MoN), chromium nitride (CrN), niobium nitride (NbN), zirconium nitride (ZrN), etc. A metal silicon nitride formed in this step, similarly, includes such materials as titanium silicon nitride (Ti—Si—N), tungsten silicon nitride (W—Si—N), tantalum silicon nitride (Ta—Si—N), molybdenum silicon nitride (Mo—Si—N), chromium silicon nitride (Cr—Si—N), niobium silicon nitride (Nb—Si—N), zirconium silicon nitride (Zr—Si—N), etc.

According to the present invention, barrier layers formed in contact holes having aspect ratios of at least about 4:1 have a substantially uniform composition throughout the depth of the contact hole. As used in connection with the description of the invention, the term "uniform composition" means that the stoichiometric ratio of metal to nitrogen or metal silicide to nitrogen present in the metal nitride or metal silicon nitride barrier layer, respectively, is substantially constant.

The nitridization in step 304 may be carried out for long enough periods so that at least a portion of the metal or metal silicide layer is converted to metal nitride or metal silicon nitride. In some instances, however, nitridization may be carried out for sufficient time such that the entire thickness of the metal or metal silicide layer is converted to metal nitride or metal silicon nitride. Those skilled in the art will recognize that in fabricating contact plugs, where a metal layer, e.g., Ti layer, may be deposited before the barrier layer to ensure a good ohmic contact, only a portion of the metal/metal silicide barrier layer may be converted to a metal nitride/metal silicon nitride barrier layer. In one embodiment of the present invention, however, nitridization is carried out until, preferably, at least about 200 Ångstroms of the top of metal or metal silicide layer is converted to metal nitride or metal silicon nitride.

The thickness of the metal nitride or metal silicon nitride obtained in step 304 of the present invention may depend on the power applied by RF generator 214 of FIG. 2 (also referred to as RF bias power). It has been observed that when higher RF bias power is employed, the nitrogen ion diffuses to a greater depth and a larger portion of the metal or metal silicide layer undergoes nitridization. While wishing not to be bound by theory, a higher RF bias power tends to increase the momentum of the active nitrogen species, e.g., $N_2^+$, $N^+$, $N_2^*$, $N^*$, etc., that impinge upon the substrate and facilitates their diffusion into the substrate to form a top layer of metal nitride or metal silicon nitride.

FIG. 4 is a table that sets forth the approximate preferred values for various parameters employed to conduct the nitridization process according to the teachings of the present invention. The parameters of the nitridization process as shown in FIG. 4 include pressure, RF bias power (i.e. power to the chuck electrode), temperature, top electrode power, and flow rate of $N_2$ gas.

Pressure refers to the pressure of nitrogen gas or the mixture of nitrogen gas and argon inside chamber 210 of FIG. 2. The pressure can be maintained at any value that provides an adequate supply of plasma for nitriding the metal or metal silicide. It generally ranges from about 1 milliTorr to about 100 milliTorr, preferably ranges from about 2 to about 50 milliTorr and more preferably ranges from about 10 to about 30 milliTorr.

The RF bias power is defined as the power output of the RF generator 214 of FIG. 2. A higher RF bias power tends to increase the momentum of the nitrogen ions that impinge upon the substrate, nitriding the metal or metal silicide layer to a greater extent. It generally ranges from about 0 watts to about 1000 watts, preferably ranges from about 0 to 500 watts and more preferably ranges from about 10 watts to about 300 watts.

The substrate temperature is approximated from the temperature of chuck 204 of FIG. 2 which with adequate heat transfer, is roughly the same, or nearly the same as the overlaying substrate. At high substrate temperatures, a higher rate of nitrogen ion diffusion through the substrate is expected. If the electrode temperature is too high, however, the process may suffer from drawbacks like the requirement of high thermal budget and incompatibility with low temperature metal alloys. Thus, the electrode temperature must be chosen to balance a good rate of diffusion against high thermal budget and any incompatibility issues. The temperature generally ranges from about 20 to about 300° C., preferably ranges from about 20 to about 200° C., more preferably ranges from about 20 to about 100° C.

The top electrode power is defined as the power output of the RF generator 224 of FIG. 2. A higher top electrode power tends to generate a higher density of plasma. It generally ranges from about 200 to about 3000 watts, preferably ranges from about 400 to about 1500 watts and more preferably ranges from about 500 to about 750 watts. The plasma systems employed in this invention are designed such that the plasma density is controlled by the top electrode power and the bias on the substrate is controlled by the bottom power. Because the two power sources affect each other, one may be left constant while the other might be adjusted.

Flow rate of gas refers to the flow rate of source gas into chamber 210 of FIG. 2. The flow rate of $N_2$ and mixture of $N_2$ and Ar gas may be substantially similar. It generally ranges from about 10 to about 1000 standard cubic centimeters per second (sccm), preferably from about 20 to about 500 standard cubic centimeters per second (sccm) and more preferably from about 50 to about 200 sccm.

The nitridization process of the present invention is a marked improvement over the conventional processes of forming a barrier layer. By way of example, the barrier layer fabricated according to the present invention in contact holes having aspect ratios of at least about 4:1 have a substantially uniform composition throughout the depth of the contact hole. Thus, the oxide layer in ICs having such deep contact holes is well coated against the ingress of conductive particles that can lower the insulating properties of the substrate layer, rendering the entire device inoperable. As another example, nitridization of the metal or metal silicide layer by a high density, low pressure plasma reactor eliminates the poor repeatability of the barrier layer composition encountered by the conventional reactive sputtering processes. In the present invention, metal or metal silicide may be deposited in by sputtering, for example, in the absence of reactive gaseous mixture that typically include $N_2$ gas. Therefore, the possibility of the metallic target layer undergoing undesired nitridization may be totally eliminated. As yet another example, nitridization in a high density, low pressure plasma reactor also effectively eliminates the risk of excessive gas phase nucleation.

While this invention has been described in terms of several preferred embodiments, there are alterations, permutations, and equivalents which fall within the scope of this invention. It should also be noted that there are many alternative ways of implementing the methods and apparatuses of the present invention. By way of example, the present invention describes nitridization of a metal or metal silicide layer to form a barrier layer, in principle there is no reason why such nitridization could not be implemented for other application of metallic layers. It is therefore intended that the following appended claims be interpreted as including all such alterations, permutations, and equivalents as fall within the true spirit and scope of the present invention.

What is claimed is:

1. A process for nitridization to form a barrier layer on a substrate, the method comiprising:

depositing a layer metal silicide including at least one of titanium silicide, tungsten silicide, tantalum silicide, molybdenum silicide, chromium silicide, niobium silicide, and zirconium silicide on a surface of said substrate such that an opening in a dielectric layer of said substrate is at least partially filled;

placing said substrate into a high density, low pressure plasma reactor;

introducing into said high density, low pressure plasma reactor a gas including nitrogen; and striking a plasma in said high density, low pressure plasma reactor to form said barrier layer by nitridization of at least a portion of said layer of metal silicide, said portion being converted by said nitridization to a composition of metal silicon nitride, respectfully, said composition being substantially uniform along a depth of said opening in said dielectric layer of said substrate, and said barrier layer being thick enough to effectively prevent diffusion of conductive particles from a conductive material disposed above said layer of metal silicide into said dielectric layer.

2. The process of claim 1, wherein the high density, low pressure plasma reactor is an inductive plasma reactor.

3. The process of claim 1, wherein portion of said layer of metal silicide converted to a composition of metal silicon nitride is a top portion of said layer of metal silicide, said top portion being about 200 Angstroms thick.

4. The process of claim 1, wherein said opening is a contact hole or a via having an aspect ratio of at least about 4:1.

5. The process of claim 1, wherein said depositing said layer of metal silicide comprises sputter depositing said layer of metal silicide.

6. The process of claim 1, wherein said depositing said layer of metal silicide by chemical vapor deposition and maintaining said substrate at a temperature of no more than about 300° C.

7. The process of claim 1, wherein nitrogen and argon are introduced into said high density, low pressure plasma reactor at a flow ratio of between about 2:1 and about 10:1.

8. The process of claim 1, wherein the step of introducing a gas into the transformer coupled plasma reactor provides a gas pressure in the reactor of between about 1 and about 100 milliTorr.

9. The process of claim 1, wherein said step of striking a plasma involves supplying radio frequency power to a transformer coupled plasma reactor coil electrode at a power of between about 200 and 3000 Watts.

10. The process of claim 1, further comprising a step of applying bias to an electrode located below said substrate and said electrode located below said substrate is provided with a power of between about 0 and about 1000 Watts.

11. The process of claim 1, wherein said introducing comprises introducing said gas at a flow rate that is between about 10 and about 1000 standard cubic centimeters per minute.

12. The process of claim 1, further comprising a step of depositing at least one of tungsten, aluminum and copper on said substrate and substantially filling the opening in the dielectric layer after said step of striking a plasma is performed.

13. A process for nitridization to form a barrier layer on a substrate, the method comprising:

depositing a layer of metal silicide on a surface of said substrate such that an opening in a dielectric layer of said substrate is at least partially filled;

placing said substrate into a high density, low pressure plasma reactor;

introducing into said high density, low pressure plasma reactor a gas including nitrogen; and striking a plasma in said high density, low pressure plasma reactor to form said barrier layer by nitridization of at least a portion of said layer of metal silicide, said portion being converted by said nitridization to a composition of metal silicon nitride including at least one of titanium silicon nitride, tungsten silicon nitride, tantalum silicon nitride, molybdenum silicon nitride, chromium silicon nitride, niobium silicon nitride, and zirconium silicon nitride respectively, said composition being substantially uniform along a depth of said opening in said dielectric layer of said substrate, and said barrier layer being thick enough to effectively prevent diffusion of conductive particles from a conductive material disposed above said layer of metal silicide into said dielectric layer.

14. The process of claim 13, wherein the high density, low pressure plasma reactor is an inductive plasma reactor.

15. The process of claim 13, wherein portion of said layer of metal silicide converted to a composition of metal silicon nitride is a top portion of said layer of metal silicide, said top portion being about 200 Angstroms thick.

16. The process of claim 13, wherein said opening is a contact hole or a via having an aspect ratio of at least about 4:1.

17. The process of claim 13, wherein said depositing said layer of metal silicide comprises sputter depositing said layer of metal silicide.

18. The process of claim 13, wherein said depositing said layer of metal silicide by chemical vapor deposition and maintaining said substrate at a temperature of no more than about 300° C.

19. The process of claim 13, wherein nitrogen and argon are introduced into said high density, low pressure plasma reactor at a flow ratio of between about 2:1 and about 10:1.

20. The process of claim 13, wherein the step of introducing a gas into the transformer coupled plasma reactor provides a gas pressure in the reactor of between about 1 and about 100 milliTorr.

21. The process of claim 13, wherein said step of striking a plasma involves supplying radio frequency power to a transformer coupled plasma reactor coil electrode at a power of between about 200 and 3000 Watts.

22. The process of claim 13, further comprising a step of applying bias to an electrode located below said substrate and said electrode located below said substrate is provided with a power of between about 0 and about 1000 Watts.

23. The process of claim 13, wherein said introducing comprises introducing said gas at a flow rate that is between about 10 and about 1000 standard cubic centimeters per minute.

24. The process of claim 13, further comprising a step of depositing at least one of tungsten, aluminum and copper on said substrate and substantially filling the opening in the dielectric layer after said step of striking a plasma is performed.

* * * * *